United States Patent
Luessem et al.

(10) Patent No.: US 9,899,616 B2
(45) Date of Patent: Feb. 20, 2018

(54) ORGANIC FIELD EFFECT TRANSISTOR AND METHOD FOR PRODUCING THE SAME

(75) Inventors: Bjoern Luessem, Kent, OH (US); Alexander Zakhidov, Austin, TX (US); Hans Kleeman, Dresden (DE); Karl Leo, Dresden (DE)

(73) Assignee: NOVALED GMBH, Dresden (DE)

( * ) Notice: Subject to any disclaimer, the term of this patent is extended or adjusted under 35 U.S.C. 154(b) by 0 days.

(21) Appl. No.: 14/390,692

(22) PCT Filed: Jun. 19, 2012

(86) PCT No.: PCT/EP2012/061700
§ 371 (c)(1),
(2), (4) Date: Apr. 14, 2015

(87) PCT Pub. No.: WO2013/149678
PCT Pub. Date: Oct. 10, 2013

(65) Prior Publication Data
US 2015/0270503 A1    Sep. 24, 2015

(30) Foreign Application Priority Data

Apr. 5, 2012 (EP) .................... 12163472
Apr. 27, 2012 (EP) .................... 12166029

(51) Int. Cl.
*H01L 29/08* (2006.01)
*H01L 51/05* (2006.01)
(Continued)

(52) U.S. Cl.
CPC .......... *H01L 51/0562* (2013.01); *B82Y 10/00* (2013.01); *H01L 51/002* (2013.01);
(Continued)

(58) Field of Classification Search
CPC ............. H01L 51/0562; H01L 51/0545; H01L 51/002
See application file for complete search history.

(56) References Cited

U.S. PATENT DOCUMENTS

| | | | |
|---|---|---|---|
| 5,629,530 | A | 5/1997 | Brown et al. |
| 2003/0092232 | A1 | 5/2003 | Klauk et al. |

(Continued)

FOREIGN PATENT DOCUMENTS

| | | |
|---|---|---|
| EP | 2 194 582 A1 | 6/2010 |
| JP | 2006-261640 A | 9/2006 |

(Continued)

OTHER PUBLICATIONS

Capelli, Raffaella & Toffanin, Stefano & Generali, Gianluca & Usta, Hakan & Facchetti, Antonio & Muccini, Michele. (2010). Organic light-emitting transistors with an efficiency that outperforms the equivalent light-emitting diodes. Nature materials. 9. 496-503.*

(Continued)

*Primary Examiner* — Lex Malsawma
*Assistant Examiner* — Laura Dykes
(74) *Attorney, Agent, or Firm* — Eversheds Sutherland (US) LLP (57) ABSTRACT

The disclosure relates to organic field effect transistors, and methods for producing organic field effect transistors. The organic field effect transistors may include a first electrode, and a second electrode, the electrodes providing a source electrode and a drain electrode, an intrinsic organic semiconducting layer in electrical contact with the first and second electrode, a gate electrode, a gate insulator provided between the gate electrode and the intrinsic organic semiconducting layer, and a doped organic semiconducting layer including an organic matrix material and an organic dopant.

10 Claims, 7 Drawing Sheets

(51) Int. Cl.
  *B82Y 10/00* (2011.01)
  *H01L 51/00* (2006.01)
  *H01L 51/10* (2006.01)

(52) U.S. Cl.
  CPC ...... *H01L 51/0002* (2013.01); *H01L 51/0021* (2013.01); *H01L 51/105* (2013.01); *H01L 51/001* (2013.01); *H01L 51/0046* (2013.01); *H01L 51/0059* (2013.01); *H01L 51/102* (2013.01)

(56) References Cited

U.S. PATENT DOCUMENTS

| | | |
|---|---|---|
| 2005/0040390 A1 | 2/2005 | Pfeiffer et al. |
| 2005/0242342 A1 | 11/2005 | Suh et al. |
| 2005/0255334 A1 | 11/2005 | Kang et al. |
| 2006/0033098 A1 | 2/2006 | Shih et al. |
| 2006/0202196 A1 | 9/2006 | Kawakami et al. |
| 2007/0018153 A1* | 1/2007 | Cumpston .......... H01L 51/5032 257/40 |
| 2007/0148812 A1* | 6/2007 | Wu .................. H01L 51/002 438/99 |
| 2008/0164461 A1* | 7/2008 | Wilson .............. H01L 51/105 257/40 |
| 2009/0179189 A1 | 7/2009 | Werner et al. |
| 2009/0315455 A1 | 12/2009 | Wang et al. |
| 2010/0051923 A1* | 3/2010 | Denker .............. H01L 51/0529 257/40 |
| 2010/0065831 A1* | 3/2010 | Shimoji ............. H01L 27/3274 257/40 |
| 2010/0065833 A1* | 3/2010 | Huang ............... H01L 51/0562 257/40 |
| 2010/0096625 A1 | 4/2010 | Benwadih |
| 2011/0248267 A1 | 10/2011 | Wei et al. |
| 2011/0266529 A1* | 11/2011 | Zhao .................. B82Y 10/00 257/40 |

FOREIGN PATENT DOCUMENTS

| | | |
|---|---|---|
| JP | 2011-060828 A | 3/2011 |
| WO | 2006/040548 A2 | 4/2006 |
| WO | 2009062457 A1 | 5/2009 |

OTHER PUBLICATIONS

Li, J. X.W. Zhang, L. Zhang, K. Haq, Z.Y. Jiang, W.Q. Zhu, Z.L. Zhang. Improving organic transistor performance through contact-area-limited doping. Solid State Commun., 149 (2009), pp. 1826-1830.*

He, Gufeng; Schneider, Oliver; Qin, Dashan; Zhou, Xiang; Pfeiffer, Martin; Leo, Karl. Very high-efficiency and low voltage phosphorescent organic light-emitting diodes based on a p-i-n junction. Journal of Applied Physics (2004), 95(10), 5773-5777.*

Blochwitz et al., "Low Voltage Organic Light Emitting Diodes Featuring Doped Phthalocyanine as Hole Transport Material," Applied Physics Letters, 1998, 73(6):729-731.

D'Andrade et al., "Operational Stability of Electrophosphorescent Devices Containing p and n Doped Transport Layers," Applied Physics Letters, 2003, 83(19):3858-3860.

Gao et al., "Controlled p-doping of Zinc Phthalocyanine by Coevaporation with Tetrafluorotetracyanoquinodimethane: A Direct and Inverse Photoemission Study," Applied Physics Letters, 2001, 79(24):4040-4042.

Huang et al., "Organic Field-Effect Inversion-Mode Transistors and Single-Component Complementary Inverters on Charged Electrets," Journal of Applied Physics, 2006, 100:114512-1 through 114512-9.

Meijer, "Dopant Density Determination in Disordered Organic Field-Effect Transistors," Journal of Applied Physics, 2003, 93(8):4831-4835.

Walzer et al., "High Efficient Organic Devices Based on Electrically Doped Transport Layers," Chem. Rev., 2007, 107:1233-1271.

PCT International Search Report for PCT Application No. PCT/EP2012/061700 dated Aug. 10, 2012 (4 pages).

Japanese Office Action for JP Application No. 2015-503770 dated Mar. 15, 2016 (English translation).

* cited by examiner

ORGANIC FIELD EFFECT TRANSISTOR AND METHOD FOR PRODUCING THE SAME

CROSS-REFERENCE TO RELATED APPLICATIONS

This is a submission pursuant to 35 U.S.C. 154(d)(4) to enter the national stage under 35 U.S.C. 371 for PCT/EP2012/061700, filed 19 Jun. 2012. Priority is claimed under 35 U.S.C. 119(a) and 35 U.S.C. 365(b) to European Application No. 12 163 472.9, filed 5 Apr. 2012 and European Application No. 12 166 029.4, filed 27 Apr. 2012. The subject matters of PCT/EP2012/061700 and European Application Nos. 12 163 472.9 and 12 166 029.4 are incorporated herein by reference.

The invention relates to an organic field effect transistor and a method for producing the same.

BACKGROUND OF THE INVENTION

Ever since the invention of organic field effect transistors (OFETs) in the 1980s their performance could be continuously improved. Nowadays, OFETs are used for driving e-ink displays, printed RFID tags, and flexible electronics. The advantages of OFETs compared to silicon technology are the possibility to realize thin and flexible circuits at low process temperatures on large areas.

In general, an organic field effect transistor comprises a gate electrode, a source electrode and a drain electrode. Further, the OFET comprises an organic semiconductor and a gate insulator which separates the gate electrode from the organic semiconductor.

Despite the progress, the widespread application of OFETs is still limited due to their low performance and stability. However, there is a large potential for improvement by the development of advanced OFET structures.

Although the organic doping technology has been shown to be a key technology for highly efficient opto-electronic devices, the use of doped organic layers in organic transistors is much less common.

There are three different approaches to improve the performance of OFETs.

For example, doping can be used to reduce the contact resistance at the source and drain electrodes. A thin p- or n-doped layer between the metallic electrodes and the organic semiconductor forms an ohmic contact which increases the tunnel currents and enhances the injection of charge carriers.

Some groups reported on the effects of channel "doping" on the OFET performance. For example, it is possible to switch pentacene transistors from p-type to n-type using a monolayer of Ca at the oxide surface. The monolayer covers the surface of the insulating layer completely and acts as a local "pseudo-dopant". There is no charge carrier transfer between Ca and the insulating layer. Instead, an electric field is generated by the Ca atoms in the monolayer. The Ca monolayer fills electron traps at the interface between the organic semiconductor and the gate insulator. It was shown that "doping" the channel of an n-OFET by an air-stable n-dopant can increase the air-stability of n-type transistors.

Furthermore, it has been reported that the threshold voltage can be shifted by the doping concentration. Meijer et al. Journal of Applied Physics, vol. 93, no, 8, p. 4831, 2003, studied the effect of doping by oxygen exposure on polymer transistors. Although a shift of the switch-on voltage (the Hatband voltage) was observed, the effect was not related to doping by the authors. Similarly, other authors found a similar shift of threshold voltage with applying a dopant, but often this effect is rather related to the influence of contact doping than to channel doping.

Inversion FETs are normally OFF and an inversion channel has to be formed by an applied gate voltage in order to switch the transistor ON. Inversion FETs are used in CMOS circuits and are the most basic building block of all integrated circuits. It is known that the inversion regime cannot be reached in organic MIS (metal insulator semiconductor) capacitors. However, it has been predicted by simulations that an inversion channel can be formed in FET structures, if minority carriers are injected at the source and drain electrodes. Huang et al. Journal of Applied Physics, vol. 100, no. 11, p. 114512, 2006, could show that a normally n-conducting intrinsic material can be made p-conductive by charging the gate insulator prior to deposition of the organic layer by a corona discharge.

Document US 2010/0096625 A1 discloses an organic field effect transistor comprising a substrate on which a source and a drain electrode are arranged. A semiconducting layer is deposited on top of the electrodes and in electrical contact with the electrodes. The semiconducting layer is formed with a lower sublayer and an upper sublayer. On top of the upper sublayer a dielectric layer and a gate electrode are provided. The semiconductor materials of the semiconducting layer may contain inorganic particles such as nanotubes or conductive silicon filaments. The lower and upper sublayer can be n-type or p-type and can have doping of the same kind.

In document U.S. Pat. No. 5,629,530 a field effect transistor with a source region, a drain region and a interposed n-type channel region is disclosed. The channel region is provided with a gate electrode that is separated from the channel region by an insulating layer.

An organic thin film transistor is described in document US 2006/0033098 A1. The transistor comprises a substrate, a gate electrode, a gate dielectric layer which covers the entire gate electrode, a source electrode, a drain electrode, an active channel layer and a source interfacial layer. A potential barrier between the source electrode and the active channel layer is reduced by adding an agent into the active channel layer.

The document EP 2 194 582 A1 describes an organic thin film transistor with a substrate, a gate electrode, a source electrode, a drain electrode, an insulator layer, an organic semiconducting layer and a channel control layer that is arranged between the organic semiconducting layer and the insulator layer. The channel control layer includes an amorphous organic compound having an ionization potential of less than 5.8 eV.

In document US 2003/0092232 A1 a further field effect transistor is disclosed.

SUMMARY OF THE INVENTION

It is the object of the invention to provide an organic field effect transistor with optimized working parameters and a method to produce the transistor. In particular, it is an object of the invention to provide an organic field effect transistor with a tunable threshold voltage.

According to one aspect of the invention, an organic field effect transistor is provided. The transistor comprises a first electrode and a second electrode, the electrodes providing a source electrode and a drain electrode, an intrinsic organic semiconducting layer in electrical contact with the first and second electrode, a gate electrode, a gate insulator provided between the gate electrode and the intrinsic organic semiconducting layer, and a doped organic semiconducting layer comprising an organic matrix material and an organic dopant. The doped organic semiconducting layer is provided between the gate insulator and the intrinsic organic semiconducting layer. A charge carrier channel is formed between the first and second electrode in the doped organic semiconducting layer.

According to another aspect of the invention a method for producing an organic field effect transistor is provided, wherein the method comprises the following steps providing a substrate, coating the substrate with an electrode material to form a gate electrode, depositing an insulating material to form an insulating layer, co-evaporating an organic matrix material and an organic dopant material to form a doped organic semiconducting layer, depositing an organic material to form an intrinsic organic semiconducting material, depositing another electrode material to form a first electrode and a second electrode that are in electrical contact with the intrinsic organic semiconducting layer.

DETAILED DESCRIPTION OF THE INVENTION

With the invention it is possible to tune the threshold voltage of the transistor. Two parameters determine the threshold voltage: the thickness of the doped organic semiconducting layer and the concentration of the organic dopant in the doped organic semiconducting layer. By choosing specific values for one or both of these parameters during the production of the transistor, the threshold voltage can be adjusted in a wide range. There is an interaction between the thickness of the layer and the doping concentration. A high doping concentration leads to a large amount of charge carriers in the channel. In this case it is preferred that the doped organic semiconducting layer is thin to enable an OFF state of the transistor.

The thickness of the doped organic semiconducting layer and the concentration of the organic dopant in the doped organic semiconducting layer are preferably configured to enable a conducting channel of charge carriers at the gate interface. The doped organic semiconducting layer is configured to enable a variable threshold voltage Vth. The threshold voltage of the transistor can be freely set by the doping concentration. The thickness of the doped organic semiconducting layer should preferably be sufficiently thick to form a percolated layer, more preferably a closed layer. A percolated layer is a layer which comprises islands of the material of the layer, wherein the density of the islands is high enough to enable an electrical pathway within the layer. For example, in the doped organic semiconducting layer the density of the islands that are made of the organic matrix material and the organic dopant has to be high enough to enable a conductive pathway between the first and second electrode to form a percolated layer. A closed layer is a layer without interruptions in the material of the layer. A closed layer has no regions that are free of the layer material.

The thickness of the doped organic semiconducting layer and the concentration of the dopant in the doped organic semiconducting layer can also be configured to enable a high IDS (current between the drain and source electrodes) and an ON/OFF ratio of at least four orders of magnitude under normal voltage operating condition. Preferably, the ON/OFF ratio is higher than five orders of magnitude.

Preferably, the organic dopant is spatially distributed in the matrix material of the doped organic semiconducting layer instead of being accumulated at an interface of the layer. More preferably, the distribution of the dopant is homogeneous along the dimensions of the layer. In contrast, in the prior art it is only known to apply a monolayer of a dopant material at the interface between the doped organic semiconducting layer and the gate insulator. This leads to a constant shift of the threshold voltage, for example by 5 V. Because the concentration of the dopant material is fixed in the monolayer, other values for the shift of the threshold voltage or a finer adjustment are not possible.

The matrix material (host)/dopant system is typically chosen with respect to the energy levels of a matrix and a dopant material. For a preferable combination of host and dopant the activation energy required for doping is less than the 50 meV. Such activation energy can be determined by temperature dependent capacitance-voltage measurements. Low activation energy is preferable since this guarantees a temperature independent threshold voltage of the inversion FET.

The organic dopant is a dopant made of an organic material. It is preferably an electrical dopant. Providing an electrical organic dopant in a matrix material leads to a charge transfer between the dopant and the matrix material. Electrical dopants are classified in p-dopants (oxidation reaction) and n-dopants (reduction reaction). Electrical doping is well known in the field, exemplary literature references are Gao et al, Appl. Phys. Lett. V.79, p. 4040 (2001), Blochwitz et al, Appl. Phys. Lett, V.73, p. 729 (1998), D'Andrade et al. App. Phys. Let. V.83, p. 3858 (2003), Walzer et al. Chem. Rev. V. 107, p. 1233 (2007), US2005040390A1, US2009179189A. Preferred p-doping compounds are organic molecules containing cyano groups.

Exemplary p-dopants are:
tetrafluoro-tetracyanoquinonedimethane (F4TCNQ),
2,2'-(perfluoronaphthalene-2,6-diylidene)dimalononitrile,
2,2,2-(cyclopropane-1,2,3-triylidene)tris(2-(p-cyanotetrafluorophenyl)acetonitrile), and
2,2',2''-(cyclopropane-1,2,3-triylidene)tris(2-(2,6-dichlor-3,5-difluor-4-(trifluormethyl)phenyl)acetonitrile),
2,2',2''-(cyclopropane-1,2,3-triylidene)tris(2-(perfluorphenyl)acetonitrile),
2,2',2''-(cyclopropane-1,2,3-triylidene)tris(2-(2,6-dichloro-3,5-difluoro-4-(trifluormethyl)phenyl)-acetonitrile), and
3,6-difluoro-2,5,7,7,8,8-hexacyanoquinodimethane (F2CN2TCNQ or F2-HCNQ).

Exemplary n-dopants are:
acridine orange base (AOB),
tetrakis(1,3,4,6,7,8-hexahydro-2H-pyrimido[1,2-a]pyrimidinato)ditungsten (II) (W2(hpp)4),
3,6-bis-(dimethyl amino)-acridine, and
bis(ethylene-dithio)tetrathiafulvalene (BEDT-TTF).

Preferable host-dopant combinations are (Table 1):

| matrix material (host) | dopant |
| --- | --- |
| N4,N4,N4',N4'-tetrakis(4-methoxyphenyl)biphenyl-4,4'-diamine (Meo-TPD) | 2,2'-(perfluoronaphthalene-2,6-diylidene)dimalononitrile (F6-TCNNQ) |
| Meo-TPD | F4-TCNQ |
| Meo-TPD | C60F36 |
| Pentacene | F6-TCNNQ |
| Tris(1-phenylisoquinoline)iridium(III) (Ir(piq)3) | F6-TCNNQ |
| Pentacene | F4-TCNQ |
| C60 | W2(hpp)4 |
| C60 | Cr2(hpp)4 |
| C60 | AOB |
| Pentacene | W2(hpp)4 |

-continued

| matrix material (host) | dopant |
|---|---|
| Copper(II)-1,2,3,4,8,9,10,11,15,16,17,18, 22,23,24,25-hexadecafluor-29H,31H-phthalocyanin (F16CuPc) | W2(hpp)4 |

The intrinsic organic semiconducting layer is preferably free of a dopant material. More preferably, the intrinsic organic semiconducting layer is made from a single organic material. This material can also be called a matrix material even if no dopants are present The intrinsic organic semiconducting layer and/or the doped organic semiconducting layer can comprise a matrix material with one of the following structures: crystalline, polycrystalline, amorphous and a combination thereof.

Preferentially, the doped organic semiconducting layer is in direct contact with the gate insulator. Alternatively, a passivation layer can be arranged between the gate insulator and the doped organic semiconducting layer. Herewith, trapping of electrons at the surface of the gate insulator can be avoided.

The material of the gate insulator (which can be an oxide) can be deposited by atomic layer deposition. The electrode materials of the gate electrode as well as the first and second electrode can be deposited by vacuum thermal evaporation (VTE). Alternatively, the electrode materials can be ink-jet printed while applying a conductive paste. Preferably, the layers of the OFET, namely the gate electrode and/or the first electrode and/or the second electrode and/or the intrinsic organic semiconducting layer and/or the doped organic semiconducting layer and/or the insulating layer, can be structured by shadow masks. Alternatively or supplementary, the layers of the OFET can be structured by optical lithography. The organic material for the intrinsic organic semiconducting layer can preferentially be deposited by thermal evaporation under ultra high vacuum (UHV) conditions. In a preferred embodiment, the organic material of the intrinsic organic semiconducting layer is deposited prior to the deposition of the other electrode material of the first and second electrode using the same shadow mask. Herewith, an efficient injection of charge carriers at the first and second electrode is ensured. Alternatively, the organic field effect transistor can be produced by solution based methods such as blade coating, spin coating and spray coating. Preferably, the transistor is produced by roll-to-roll coating.

In a preferred embodiment, the intrinsic organic semiconducting layer and the doped organic semiconducting layer comprise the same organic matrix material. Alternatively, the intrinsic organic semiconducting layer and the doped organic semiconducting layer can comprise different matrix materials.

In a further preferred embodiment of the invention, a mixed layer comprising a hole transport material and an electron transport material is provided in electrical contact with at least one of the first and second electrode. The mixed layer can be realized by a co-evaporated layer of a hole and an electron transporting material such as pentacene or C60, respectively.

In one preferred embodiment, the thickness of the doped organic semiconducting layer is between 1 nm and 20 nm. Preferably, the thickness of the doped organic semiconducting layer is between 2 nm and 10 nm. Preferably, the intrinsic organic semiconducting layer has a thickness of at least 1 nm, more preferably at least 2 nm. The intrinsic organic semiconducting layer has preferably at least a thickness to form a percolated layer, more preferably a closed layer.

According to another preferred embodiment, the intrinsic organic semiconducting layer and the doped organic semiconducting layer are in direct contact to each other.

According to a preferred embodiment, at least one electrode selected from the following group is made of a metallic material: the first electrode, the second electrode, and the gate electrode. The gate electrode can be formed by most metals such as Al, Au, Ag, Ti, Pt, for example. If the first and/or second electrode shall inject electrons it/they may be formed by metals with a low work function, e.g. Ti or Al. If the first and or second electrode shall inject holes it/they may be formed by metals with a large work function, e.g. Au, Ag, ITO.

Figure 5:
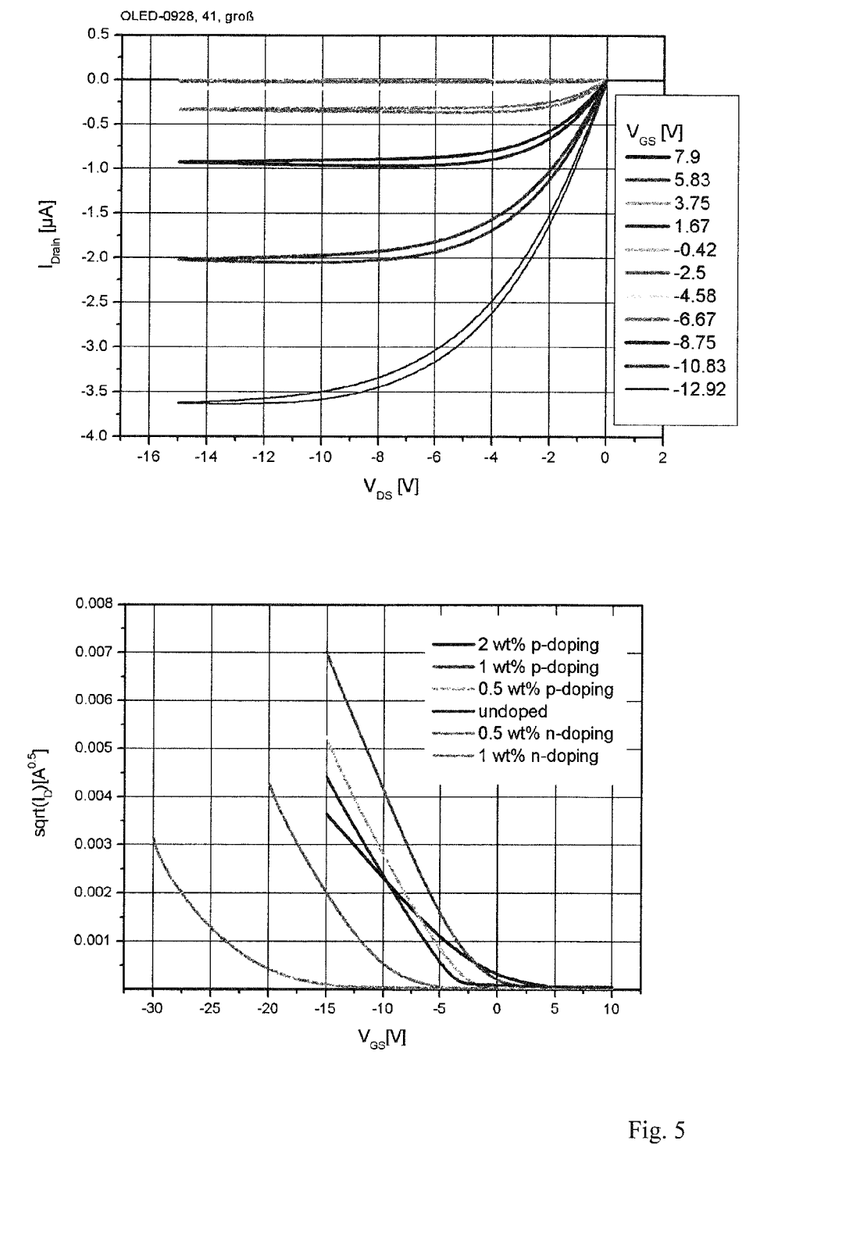

In still a further embodiment, the doped organic semiconducting layer has a dopant concentration of up to 4 wt %. Preferably, the dopant concentration is between 0.5 wt % and 4 wt %. More preferably, the dopant concentration is between 0.5 wt % and 2 wt %. The doping concentration of the doped layer has to be chosen in dependence of the targeted threshold voltages. For example, an n-doping concentration of 0.5 wt % results in a threshold voltage of 10 V and a n-doping concentration of 1 wt % leads to a threshold voltage of 20 V (see FIG. 5c and Eq. 1). To reduce parasitic leakage currents in the transistor, the doped organic semiconducting layer has to be as thin as possible. On the other hand, it has to be thick enough to form a percolated layer, more preferably a closed layer, and to control the Fermi Level in the doped organic semiconducting layer.

In a preferred embodiment, an injection layer is provided adjacent to at least one of the first and second electrode. The injection layer improves an injection of charge carriers from the first and or second electrode into the charge carrier channel, respectively. An injection layer can be provided adjacent to each electrode. The injection layer(s) can be in direct contact with the intrinsic organic semiconducting layer. Alternatively or supplementary, the mixed layer can be formed by evaporation of the injection layer(s) or the first and second electrode onto a rough, polycrystalline material such as e.g. pentacene. The injection layer(s) or the first and/or second electrode will fill the grooves between the crystallites of the semiconductor and the mixed layer.

In another preferential embodiment, the injection layer comprises a dopant material. Preferably, the dopant material is an electrical dopant. Preferentially, the dopant material is an organic dopant. The injection layer may comprise a matrix material and a dopant material. Preferentially, the injection layer is made from a pure dopant material which can be arranged as a monolayer of the dopant material adjacent to the first and/or second electrode. Alternatively, the injection layer may comprise a region formed by matrix material that is doped with a dopant material and another region that is formed by a pure dopant material. Preferably, the matrix material of injection layer(s) and the matrix material of the intrinsic organic semiconducting layer are the same.

In still another preferred embodiment, the dopant material of the injection layer is of opposite type than the dopant of the doped organic semiconducting layer. By this embodiment, an inversion OFET is realized. The doped organic semiconducting layer has to be n-doped for a p-dopant material in the injection layer and p-doped for a n-dopant material in the injection layer. Hereby, a solution to increase the shift of the threshold voltage is provided. The shift of the threshold voltage Vth for the inversion FET is given by $$V_{th} = V_{FB} + 2\Phi_F + \gamma\sqrt{2\Phi_F + V_{SB}} \quad \text{(Eq. 1)}$$

$$\gamma = \frac{1}{C'_{ox}}\sqrt{2eN_D\varepsilon_0\varepsilon_r}$$

wherein $\Phi_F$ is the energy gap between the intrinsic Fermi Level position and the Fermi Level position of the doped organic layer, $V_{SB}$ is the voltage between source and bulk, $C'_{ox}$ is the gate capacitance (per unit area), $N_D$ is the doping concentration, $\varepsilon_r$ is the permittivity of the organic layer, $\varepsilon_0$ is the vacuum permittivity and e is the elementary charge. The permittivity is related to the polarizability of an organic semiconductor. Typical values of $\varepsilon_r$ for organic materials vary between 2.5 and 7. It is obvious that the influence of doping on the shift of the threshold voltage for the inversion OFET is much stronger than that of depletion type OFETs.

The first and second electrodes can inject either electrons or holes into the intrinsic semiconducting layer.

The inversion type organic field effect transistor has the following advantages over the prior art:

- The threshold voltage is precisely tunable by the doping concentration in the doped organic semiconducting layer.
- Despite the doped channel, the transistors show a large ON/OFF ratio.
- The current at a given gate voltage in the linear regime is tunable by the doping concentration.
- The transistor structures can be processed by standard vacuum or solution based deposition processes.
- The transistor structures are scalable in lateral dimensions by shadow masks, lithography, ink-jet printing, laser structuring or other structuring methods.

In a preferential embodiment, at least one of the first and second electrode and the injection layer are configured to inject minority charge carriers into the charge carrier channel. The kind of the charge carriers is defined with respect to the kind of doping of the doped organic semiconducting layer. If the doped organic semiconducting layer is doped with an n-dopant the majority charge carriers are electrons and the minority charge carriers are holes. If the doped organic semiconducting layer is p-doped the majority charge carriers are holes and the minority charge carriers are electrons.

According to a preferred embodiment, the doped organic semiconducting layer is configured to form a minority charge carrier channel through which minority charge carriers can move between the first electrode and the second electrode. The minority charge carriers can move from the first electrode to the second electrode and vice versa.

According to a further preferential embodiment, the dopant material of the injection layer is of the same type as the dopant of the doped organic semiconducting layer. By this embodiment, a depletion OFET is realized. The doped organic semiconducting layer has to be n-doped for a n-dopant material in the injection layer and p-doped for a p-dopant material in the injection layer. Although the threshold voltage is not well defined for a depletion transistor, it can be approximated by the flatband voltage VFB. Following standard semiconductor theory, the shift of the flatband voltage VFB is given by (neglecting interface and oxide traps, for p-type transistors):

$$eV_{FB} = E_{HOMO} - \eta - W_f \quad \text{(Eq. 2)}$$

wherein $E_{HOMO}$ is the HOMO (highest occupied molecular orbital) position of the organic semiconductor, $W_f$ is the work function of the gate metal and $\eta$ is the energy gap between the HOMO and the Fermi Energy. By doping, the position of the Fermi Energy (i.e. $\eta$) can be controlled. Thus, following Eq. 2, the flatband voltage can be controlled by the shift of $\eta$ due to doping.

In one preferred embodiment, at least one of the first and second electrode and the injection layer are configured to inject majority charge carriers into the charge carrier channel. Again, the kind of the charge carriers is defined with respect to the kind of doping of the doped organic semiconducting layer.

In still a further embodiment, the doped organic semiconducting layer is configured to form a majority charge carrier channel through which majority charge carriers can move between the first electrode and the second electrode. The majority charge carriers can move from the first electrode to the second electrode and vice versa.

According to a further embodiment, the first and second electrode are arranged with respect to the gate electrode such that a projection of each of the first and second electrode onto the gate electrode covers a region that is as large as a width of the first and second electrode, respectively.

BRIEF DESCRIPTION OF THE DRAWINGS

In the following the invention will be described in further detail, by way of example, with reference to different embodiments. In the figures show.

Figure 1:
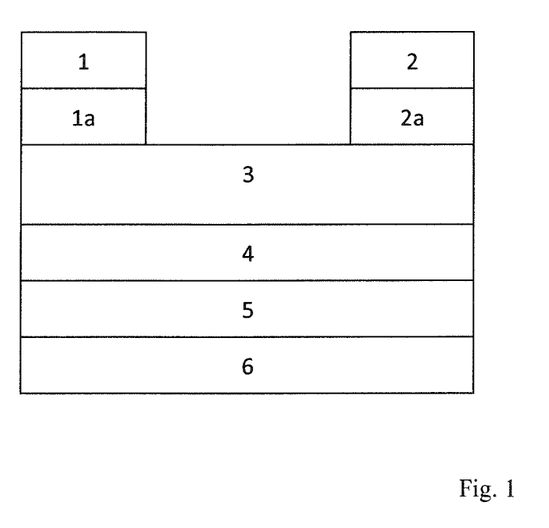
FIG. 1 a schematic representation of an OFET.

FIG. 1 shows a schematic representation of an OFET. The transistor comprises a first electrode (1), a second electrode (2), a first injection layer (1a), a second injection layer (2a), an intrinsic organic semiconducting layer (3), a doped organic semiconducting layer (4), a gate insulator (5), and a gate electrode (6). The first and second injection layers (1a, 2a) are either n-doped or p-doped. The doped organic semiconducting layer (4) is p-doped if the injection layers are n-doped or n-doped if the injection layers are p-doped to realize an inversion OFET. If a depletion OFET shall be provided the doped organic semiconducting layer (4) is p-doped if the injection layers are p-doped or n-doped if the injection layers are n-doped. Between the gate insulator (5) and the doped organic semiconducting layer (4) a depletion region is formed.

Figure 2:
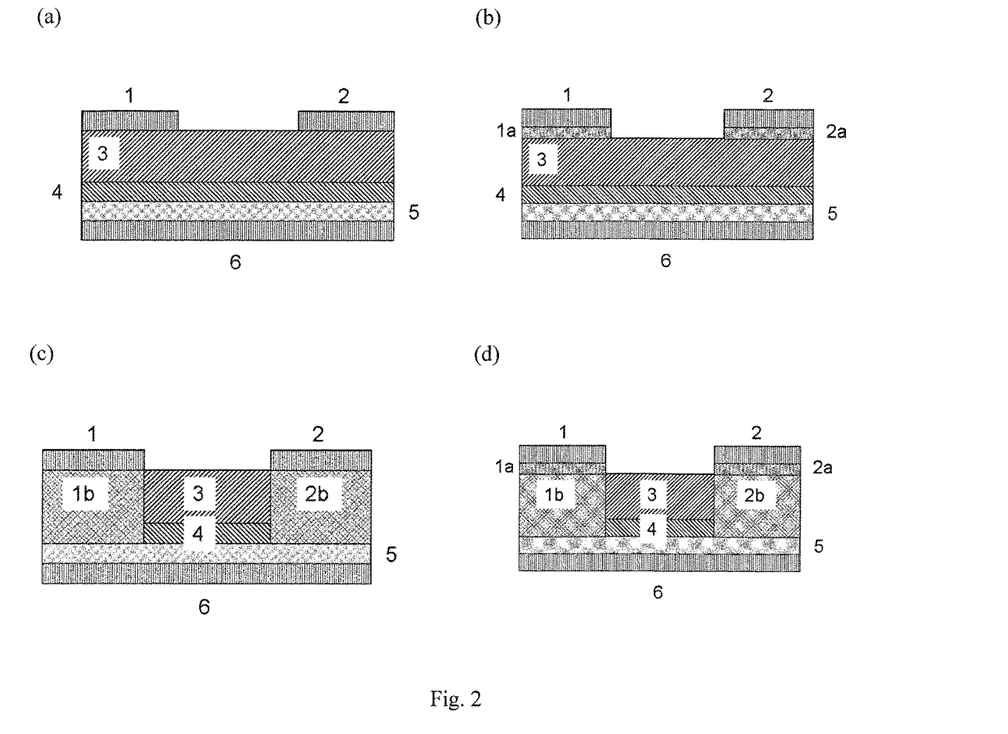
FIG. 2 a schematic representation of an OFET with a top contact bottom gate structure, FIG. 3 a schematic representation of an OFET with bottom contacts, FIG. 4 a schematic representation of an OFET with a top gate structure, FIG. 5 characteristics of an inversion OFET, FIG. 6 characteristics of a depletion OFET, FIG. 7 a comparison of the threshold shift due to doping for the inversion OFET and the depletion OFET, and FIG. 8 a plot of Eq. 1 for realistic parameters.

In FIG. 2 the OFET is realized by a top contact bottom gate structure. The transistor comprises a source electrode (1), a drain electrode (2), an intrinsic (undoped) organic semiconductor (3), a doped organic semiconductor (4), a gate insulator (5) and a gate electrode (6) (FIG. 2a). The source and drain electrodes (1, 2) can either inject electrons or holes into the semiconductor. The thickness of the doped layer has to be small (2-10 nm). The thickness of the intrinsic semiconducting layer can vary between 20 nm and 100 nm. The charge carrier mobility of the intrinsic organic semiconductor (3) has to be large. Possible materials are Pentacene, C60, dinaphtho[2,3-b:2,3-f]thieno[3,2-b]-thiophene (DNTT), or copper phthalocyanine (CuPc). The gate insulator (5) may be formed by SiO2, Al2O3, HfO2, polymethyl-methacrylate (PMMA) or other commonly used gate dielectrics.

To realize electron or hole injecting contacts, additional layers (1a and 2a) are introduced between the source and drain electrodes (1, 2) and the intrinsic organic semiconductor (3) (FIG. 2b). The additional layers (1a, 2a) can be realized by doped injection layers to form an ohmic contact at the interface to the source and drain electrodes (1, 2). The doped layers (1a, 2a) could be realized by Cs, Cr2(hpp)4, or W2(hpp)4 for n-injecting contacts, as well as F4TCNQ, MoO3, WoO3, or F6-TCNNQ, for the p-injecting contacts. The injection layers have to be p-doped, if the doped channel is n-doped or n-doped, if the doped channel is p-doped to realize an inversion OFET. The injection layers have to be p-doped, if the doped channel is p-doped or n-doped, if the doped channel is n-doped to realize a depletion OFET. The thickness of the doped injections layers can range from 2-50 nm. The following materials are suitable as matrix materials for the injection layer: MeO-TPD, Pentacene and C60. The materials can be doped with any dopant listed in Table 1.

To further enhance the injection of electrons or holes into the doped layer (4), a mixed layer (1b, 2b) can be included between the source electrode (1) or injection layer (1a) and the doped layer (4) or between the drain electrode (2) or injection layer (2a) and doped layer (4) (FIGS. 2 c) and d)).

Figure 3:
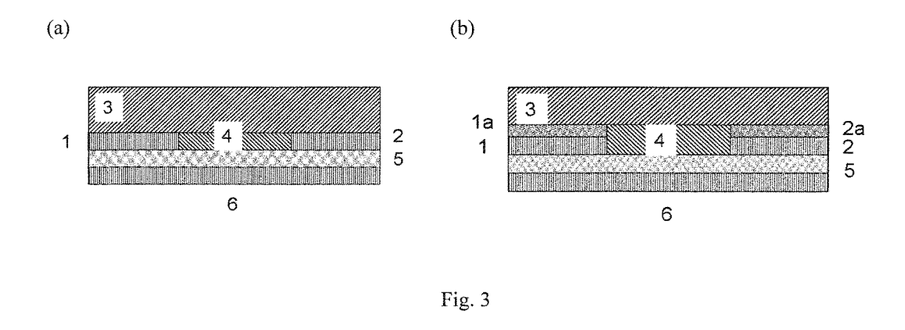

The transistor can also be realized with bottom source/drain contacts as shown in FIG. 3. The transistor comprises the source and drain electrodes (1) and (2), the intrinsic organic semiconductor (3), the doped organic semiconducting layer (4), the gate insulator (5) and the gate electrode (6). The same materials as for the top contact structures shown in FIG. 2 can be used. Again, the source and drain contacts (1, 2) can either be hole or electron injecting. This can be realized by using contacts with adapted work functions (FIG. 3a) or by using doped injection layers (1a, 2a) (FIG. 3b). For an inversion type OFET, the doped layer (4) has to be of p-type for n-type injection contacts and n-type for p-type injection contacts. The doped layer (4) has to be of p-type for p-type injection contacts and n-type for n-type injection contacts for a depletion OFET.

Figure 4:
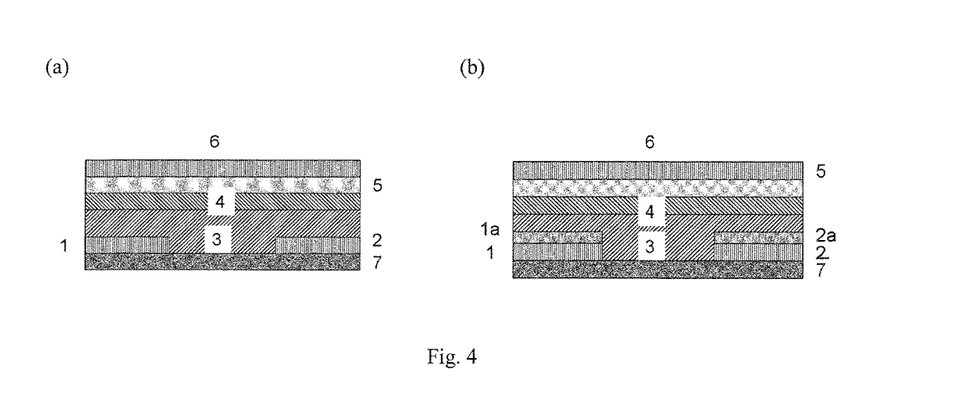

Similarly, the transistor can also be realized in a top-gate structure as shown in FIG. 4. In comparison to bottom-gate structures the doped organic semiconducting layer (4) is deposited on top of the intrinsic organic semiconducting layer (3). Otherwise, the structure is identical to bottom gate structures and the same materials can be used. Again, doped injection layers (1a and 2a) can be used to enhance charge carrier injection at the electrodes (FIG. 4b).

The shift of the threshold voltage of the transistor is even stronger for inversion type OFETs than for depletion type OFETs which is shown in the following.

An inversion type OFET is realized according to FIG. 2b. A glass substrate is coated with a gate electrode (6) consisting of 60 nm of Aluminium. The gate electrode (6) is covered by 120 nm Al2O3 deposited by atomic layer deposition forming a gate insulator (5). On top of the insulator (5), 6 nm of pentacene doped with the n-type dopant W2(hpp)4 (0, 0.5, 1 wt %) forming a doped organic semiconducting layer (4) and 40 nm of pentacene forming an intrinsic organic semiconducting layer (3) are deposited by thermal evaporation in UI-IV conditions (pressure below 10-7 mbar). The source (1) and drain (2) electrode consist of 50 nm Aluminium. To ensure p-type injection into the semiconductor (3, 4), 50 nm of pentacene doped with the p-type dopant F6-TCNNQ (4 wt %) are included between the intrinsic layer (3) and the metallic injection layers (1a and 2a). All layers except the Al2O3 layer are structured by shadow masks. The channel length and width are 300 μm and 20 mm, respectively.

The resulting output characteristic of the transistor according to FIG. 2b is shown in FIG. 5 (upper drawing). The transistor is OFF without a voltage applied to the gate (6) and a negative voltage has to be applied to turn the transistor on. The shift of the threshold voltage with n-doping concentration of the doped organic semiconducting layer (4) is shown in comparison to p-type doping in FIG. 5 (lower drawing). It can be seen that the threshold voltage can be tuned by more than 20 V with very low doping concentrations in the doped organic semiconducting layer (4) of only 0.5 wt % and 1 wt %.

Figure 6:
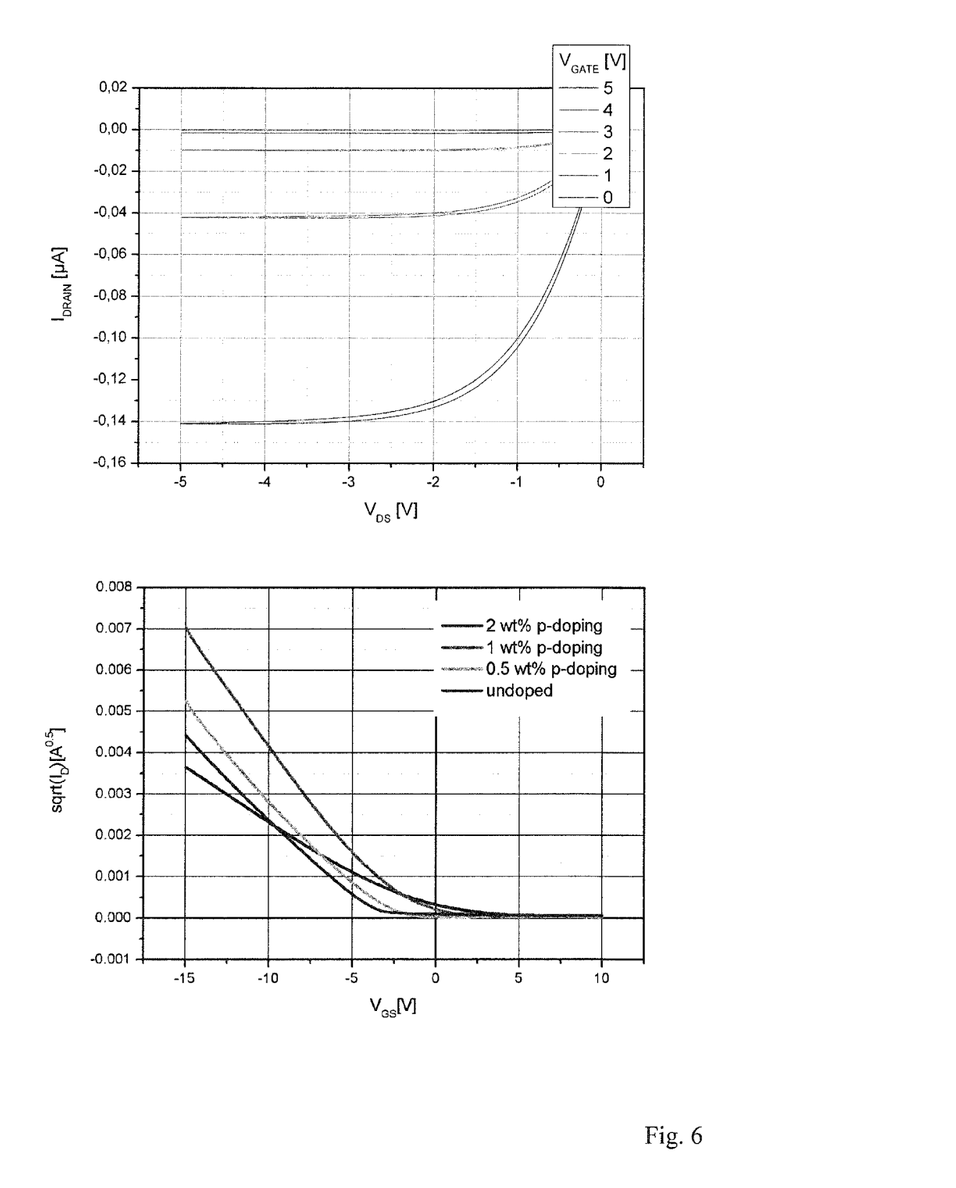

FIG. 6 shows characteristics for a depletion type OFET. The shift of the threshold voltage with p-doping concentration of the doped organic semiconducting layer (4) is shown (lower drawing of FIG. 6)

Figure 7:
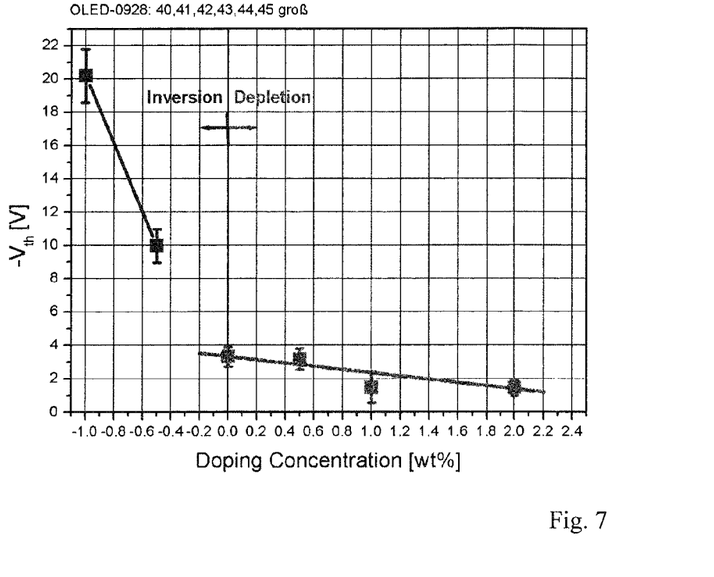

FIG. 7 shows a comparison of the threshold voltage shift due to doping for the inversion OFET and the depletion OFET. The shift is much stronger for the inversion type OFET.

Figure 8:
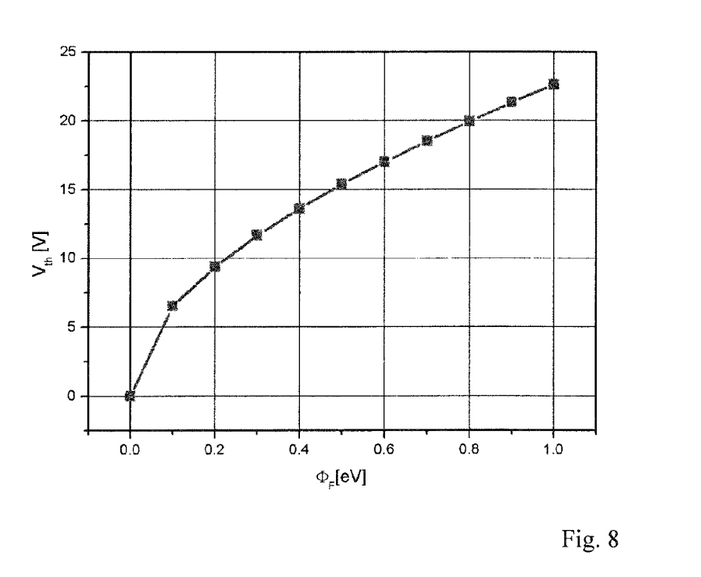

FIG. 8 shows a plot of Eq. 1 for realistic parameters. FIG. 8 shows the predicted shift of the threshold voltage for an inversion OFET. The threshold voltage shifts with the position of the Fermi Level $\Box_F$ by more than 20V. The position of the Fermi Level can be controlled by the doping concentration in the channel of the transistor. The parameters are: $N_D=10^{19}$ cm-3, HOMO=5.2 eV, LUMO=3.2 eV, $\in_{r,ox}=9$, $\in_{r,org}=3$, $d_{ox}=120$ nm, Wf=4.2 eV.

A depletion type OFET is realized in the following. A glass substrate is coated with a gate electrode (6) consisting of 60 nm of Aluminium. The gate electrode (6) is covered by 120 nm Al2O3 deposited by atomic layer deposition forming a gate insulator (5). On top of the insulator (5), 6 nm of pentacene doped with the p-type dopant F6-TCNNQ (0, 0.5, 1 wt %) forming a doped organic semiconducting layer (4) and 40 nm of pentacene forming an intrinsic organic semiconducting layer (3) are deposited by thermal evaporation in UHV conditions (pressure below 10-7 mbar). The source (1) and drain (2) electrode consist of 50 nm Aluminium. All layers except the Al2O3 layer are structured by shadow masks. The channel length and width are 300 μm and 20 mm, respectively.

The invention claimed is:
1. An organic field effect transistor, comprising:
    a first electrode and a second electrode, the first and second electrodes providing a source electrode and a drain electrode,
    an intrinsic organic semiconducting layer in electrical contact with the first electrode and the second electrode,
    a gate electrode,
    a gate insulator arranged between the gate electrode and the intrinsic organic semiconducting layer, and
    a doped organic semiconducting layer comprising a first organic matrix material and a first organic dopant, wherein the first organic dopant is a first electrical dopant, wherein the doped organic semiconducting layer is arranged between the gate insulator and the intrinsic organic semiconducting layer,
    wherein
    the doped organic semiconducting layer comprises a charge carrier channel arranged between the first electrode and the second electrode,
    an injection layer is arranged adjacent to at least one of the first electrode and the second electrode, and the injection layer comprises a second organic matrix material and a second dopant, wherein the second dopant is a second electrical dopant, and wherein the second dopant is of a type that is opposite the first dopant of the doped organic semiconducting layer.

2. The transistor according to claim 1, wherein the intrinsic organic semiconducting layer and the doped organic semiconducting layer comprise the first organic matrix material.

3. The transistor according to claim 1, wherein a mixed layer comprising a hole transport material and an electron transport material is in electrical contact with at least one of the first electrode and the second electrode.

4. The transistor according to claim 1, wherein the thickness of the doped organic semiconducting layer is between 1 nm and 20 nm.

5. The transistor according to claim 1, wherein the intrinsic organic semiconducting layer and the doped organic semiconducting layer are in direct contact with each other.

6. The transistor according to claim 1, wherein at least one electrode selected from the group consisting of the following electrodes is made of a metallic material: the first electrode, the second electrode, and the gate electrode.

7. The transistor according to claim 1, wherein the doped organic semiconducting layer has a dopant concentration of up to 4 wt %.

8. The transistor according to claim 1, wherein at least one of the first electrode, the second electrode and the injection layer is configured to inject minority charge carriers into the charge carrier channel.

9. The transistor according to claim 8, wherein the doped organic semiconducting layer is configured to form a minority charge carrier channel through which minority charge carriers can move between the first electrode and the second electrode.

10. A method for producing an organic field effect transistor, wherein the method comprises the following steps:
providing a substrate,
coating the substrate with a first electrode material to form a gate electrode,
depositing an insulating material to form an insulating layer,
co-evaporating a first organic matrix material and a first organic dopant material to form a doped organic semiconducting layer, wherein the first organic dopant material is an electrical dopant,
depositing an organic material to form an intrinsic organic semiconducting material,
depositing an injection material comprising a second organic matrix material and a second dopant material to form a doped injection layer, wherein the second dopant material is an electrical dopant, and
depositing a second electrode material to form a first electrode and a second electrode that are in electrical contact with one of the injection layer and the intrinsic organic semiconducting layer, wherein the second dopant material is of a type that is opposite the first dopant material of the doped organic semiconducting layer.

\* \* \* \* \*